(12) United States Patent
Harris et al.

(10) Patent No.: US 6,690,178 B2
(45) Date of Patent: Feb. 10, 2004

(54) ON-BOARD MICROELECTROMECHANICAL SYSTEM (MEMS) SENSING DEVICE FOR POWER SEMICONDUCTORS

(75) Inventors: Richard D. Harris, Solon, OH (US); Robert J. Kretschmann, Bay Village, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 99 days.

(21) Appl. No.: 10/039,731

(22) Filed: Oct. 26, 2001

(65) Prior Publication Data

US 2003/0080754 A1 May 1, 2003

(51) Int. Cl.$^7$ .......................... G01R 27/28; G01R 31/26
(52) U.S. Cl. ...................... 324/649; 324/768; 324/769; 324/109
(58) Field of Search ................. 324/649, 658, 324/661, 660, 99 R, 117 R, 522, 90, 768, 769, 109; 361/78; 310/309

(56) References Cited

U.S. PATENT DOCUMENTS

| | | |
|---|---|---|
| 3,886,447 A | 5/1975 | Tanaka |
| 4,560,953 A | 12/1985 | Bozio |
| 5,012,207 A | 4/1991 | Edwards |
| 5,025,346 A | 6/1991 | Tang et al. |
| 5,194,819 A | 3/1993 | Briefer |
| 5,243,861 A | 9/1993 | Kloeck et al. |
| 5,343,157 A | 8/1994 | Deschamps |

(List continued on next page.)

FOREIGN PATENT DOCUMENTS

| | | |
|---|---|---|
| EP | 0 665 590 A2 | 8/1995 |
| EP | 0 711 029 A2 | 5/1996 |
| EP | 0 763 844 A2 | 3/1997 |

OTHER PUBLICATIONS

Toumazou, C. et al., n–step Charge Injection Cancellation Scheme for Very Accurate Switched Current Circuits, Electronic Letters, V.30 (9) 680–681: 1994.

Emmerich, H., et al., A Novel Micromachined Magnetic–Field Sensor, MEMS 99 IEEE Conference, Jan. 17–21, 199, IEEE Catalog No. 99ch36291c.

Madou, Marc, Fundamentals of Microfabrication, Chapters 2–4, CRC Press LLC, Boca Raton, FL: 1997.

Kovacs, Gregory T.A., Micromachined Transducers Sourcebook, Table of Contents, pp. 77–119 and Index, WCB McGraw–Hill, U.S.A.: 1998.

Teegarden, Darrell et al., How to Model and Simulate Microgyroscope Systems, IEEE Spectrum, 66–75, Jul. 1998.

Emmerich, Harald et al., Magnetic Field Measurements with a Novel Surface Micromachined Magnetic–Field Sensor, IEEE Transactions on Electron Devices, V. 47 (5) 972–977, May 2000.

McGruer, N.E. et al., Electrostatically Actuated Microswitches; Scaling Properties, Solid–State Sensor and Actuator Workshop, Hilton Head Island, South Carolina, Jun. 8–11, 1998, pp. 132–135.

(List continued on next page.)

Primary Examiner—Anjan K. Deb
(74) Attorney, Agent, or Firm—Quarles & Brady LLP; R. Scott Speroff

(57) ABSTRACT

An on-board micro-electromechanical (MEMS) isolator is provided on board a power semiconductor device for measuring voltage, current, or both. In particular, the power semiconductor may comprise a plurality of transistors connected in parallel, such that a MEMS isolator connected in parallel with one of the transistors measures voltage across the semiconductor. A MEMS isolator may further be connected in series with the transistors to measure current flow thereacross. A compensation circuitry may be provided to receive the current output from the isolator, and determine total current flow through the power semiconductor.

24 Claims, 5 Drawing Sheets

U.S. PATENT DOCUMENTS

| | | | |
|---|---|---|---|
| 5,359,893 A | 11/1994 | Dunn | |
| 5,399,232 A | 3/1995 | Albrecht et al. | 216/2 |
| 5,413,668 A | 5/1995 | Aslam et al. | |
| 5,417,312 A | 5/1995 | Tsuchitani et al. | |
| 5,424,650 A | 6/1995 | Frick | |
| 5,491,604 A * | 2/1996 | Nguyen et al. | 361/78 |
| 5,517,123 A * | 5/1996 | Zhao et al. | 324/458 |
| 5,536,988 A | 7/1996 | Zhang et al. | |
| 5,563,343 A | 10/1996 | Shaw et al. | |
| 5,572,057 A | 11/1996 | Yamamoto et al. | |
| 5,578,528 A | 11/1996 | Wuu et al. | 216/2 |
| 5,578,976 A | 11/1996 | Yao | |
| 5,585,311 A | 12/1996 | Ko | |
| 5,600,190 A | 2/1997 | Zettler | |
| 5,646,432 A | 7/1997 | Iwaki et al. | |
| 5,658,698 A | 8/1997 | Yagi et al. | |
| 5,723,353 A | 3/1998 | Muenzel et al. | 438/48 |
| 5,761,350 A | 6/1998 | Koh | |
| 5,783,340 A | 7/1998 | Farino et al. | |
| 5,798,283 A | 8/1998 | Montague et al. | |
| 5,804,314 A | 9/1998 | Field et al. | |
| 5,815,051 A | 9/1998 | Hamasaki et al. | |
| 5,834,864 A | 11/1998 | Hesterman et al. | |
| 5,877,038 A | 3/1999 | Coldren et al. | |
| 5,903,380 A | 5/1999 | Motamedi et al. | |
| 5,920,978 A | 7/1999 | Koshikawa et al. | |
| 5,943,155 A | 8/1999 | Goossen | |
| 5,946,549 A | 8/1999 | Itoigawa et al. | 438/53 |
| 5,955,932 A | 9/1999 | Nguyen et al. | |
| 5,959,516 A | 9/1999 | Chang et al. | |
| 5,995,688 A | 11/1999 | Aksyuk et al. | |
| 6,008,138 A | 12/1999 | Laermer et al. | 438/725 |
| 6,046,066 A | 4/2000 | Fang et al. | |
| 6,060,336 A | 5/2000 | Wan | |
| 6,071,426 A | 6/2000 | Lee et al. | |
| 6,094,102 A | 7/2000 | Chang et al. | |
| 6,100,477 A | 8/2000 | Randall et al. | |
| 6,114,794 A | 9/2000 | Dhuler et al. | |
| 6,116,756 A | 9/2000 | Peeters et al. | |
| 6,127,767 A | 10/2000 | Lee et al. | |
| 6,137,206 A | 10/2000 | Hill | |
| 6,144,545 A | 11/2000 | Lee et al. | |
| 6,149,190 A | 11/2000 | Galvin et al. | |
| 6,159,385 A | 12/2000 | Yao et al. | 216/2 |
| 6,170,332 B1 | 1/2001 | MacDonald et al. | |
| 6,188,322 B1 | 2/2001 | Yao et al. | |
| 6,232,150 B1 | 5/2001 | Lin et al. | |
| 6,232,841 B1 | 5/2001 | Bartlett et al. | |
| 6,232,847 B1 | 5/2001 | Marcy, 5th et al. | |
| 6,236,281 B1 | 5/2001 | Nguyen et al. | |
| 6,257,705 B1 | 7/2001 | Silverbrook | |
| 6,265,238 B1 | 7/2001 | Yaji et al. | |
| 6,276,205 B1 | 8/2001 | McNie et al. | 73/504.13 |
| 6,307,169 B1 | 10/2001 | Sun et al. | |
| 6,316,278 B1 | 11/2001 | Jacobsen et al. | |
| 6,348,788 B1 * | 2/2002 | Yao et al. | 324/99 R |
| 6,356,378 B1 | 3/2002 | Huibers | |
| 6,356,689 B1 | 3/2002 | Greywall | |
| 6,369,931 B1 | 4/2002 | Funk et al. | 359/223 |
| 6,373,682 B1 | 4/2002 | Goodwin-Johansson | |
| 6,384,353 B1 | 5/2002 | Huang et al. | |
| 6,391,742 B2 | 5/2002 | Kawai | |
| 6,400,009 B1 | 6/2002 | Bishop et al. | |
| 6,411,214 B1 | 6/2002 | Yao et al. | |
| 6,417,743 B1 * | 7/2002 | Mihailovich | 333/24 C |
| 6,428,713 B1 | 8/2002 | Christenson et al. | 216/2 |
| 6,463,339 B1 | 10/2002 | Vasko | |
| 6,465,929 B1 * | 10/2002 | Levitan et al. | 310/309 |
| 6,466,005 B1 | 10/2002 | Yao et al. | |
| 6,497,141 B1 | 12/2002 | Turner et al. | |
| 6,504,356 B2 | 1/2003 | Yao et al. | |
| 6,547,973 B2 | 4/2003 | Field | 216/2 |
| 2002/0017132 A1 | 2/2002 | McNie et al. | |
| 2002/0021119 A1 | 2/2002 | Yao et al. | 324/90 |
| 2002/0158039 A1 | 10/2002 | Harris et al. | 216/2 |

OTHER PUBLICATIONS

Miyajima, Hiroshi et al., High–Aspect–Ratio Photolithography for MEMS Applications, J. of Microelectromechanical Sys., V.4(4) 220–229, Dec. 1995.

Lu, Crist et al., A Monolithic Surface Micromachined Accelerometer with Digital Output, IEEE J. of Solid State Circuits, V. 30 (12) 1367–1373, Dec. 1995.

Chen, Ming–Jer et al., Weak Inversion Charge Injection in Analog MOS Switches, IEEE J. of Solid–State Circuits, V. 30 (5) 604–606, May 1995.

Lemkin, Mark A. et al., A Fully Differential Lateral S? Accelerometer with Drift Cancellation Circuitry, Solid-–State Sensor and Actuator Workshop, Hilton Head, South Carolina, Jun. 2–6, 1996, pp. 90–93.

Boser, Bernhard E. et al., Surface Micromachined Accelerometers, IEEE J. of Solid–State Circuits, V. 31 (3) 366–375, Mar. 1996.

Fedder, Gary K. et al., Multimode Digital Control of a Suspended Polysilicon Microstructure, J. of Microelectromechanical Sys., V. 5 (4) 283–297, Dec. 1996.

Noriega, Gerardo, Sigma–Delta A/D Converters–Audio and Medium Bandwidths, Technical Notes–DT3 from RMS Instruments website: www.rmsinst.com, 6 pages, Feb. 1996.

Internet page: Decimator Filter DLL, NeuroDimension Inc.: www.nd.com , May 31, 2001.

* cited by examiner-

US 6,690,178 B2

ON-BOARD MICROELECTROMECHANICAL SYSTEM (MEMS) SENSING DEVICE FOR POWER SEMICONDUCTORS

CROSS REFERENCE TO RELATED APPLICATIONS

STATEMENT REGARDING FEDERALLY SPONSORED RESEARCH OR DEVELOPMENT

Not Applicable.

FIELD OF THE INVENTION

The present invention relates to power semiconductors and, in particular, to a microelectromechanical system (MEMS) device providing on-board current and voltage sensing capabilities for power semiconductors.

BACKGROUND OF THE INVENTION

Many circuit applications in use today employ semiconductor devices to control large currents and voltages. The measurements of these voltages and currents are crucial to determine, for example, average current flowing, RMS current, peak current, average voltage, RMS voltage, or peak voltage. The measured value may be used for device protection, closed loop control, or many other purposes. Because the voltage or current may typically not be referenced to the same circuit point as the rest of the electronics, isolation of the measurement is usually necessary. Furthermore, it is desirable to minimize the cost associated with the measurements.

A conventional current sensor 25 used with a power semiconductor 11 is illustrated in FIG. 1, wherein a plurality of transistor elements 19 are fabricated on a single chip and are connected in parallel to a source 23 to control a load 17. An external current sensor 25, which may take the form of shunt resistors and associated circuitry, current transformers and associated circuitry, Hall Effect sensors and associated circuitry, and the like, is connected in series with the transistor elements 19. The transistor elements 19 are connected in parallel so as to limit the amount of current that is required to flow through each transistor element. Disadvantageously, the sensor 25 requires external connection to the circuit and subsequent calibrated by the end user for reliable operation.

Likewise, a conventional voltage sensor used with a power semiconductor 11 is illustrated in FIG. 2. The voltage across the transistor elements 19 is sensed and measured by sensor 27.

Electrical isolators are used to provide electrical isolation between circuit elements for the purposes of voltage level shifting, electrical noise reduction, and high voltage and current protection.

Circuit elements may be considered electrically isolated if there is no path in which a direct current (DC) can flow between them. Isolation of this kind can be obtained by capacitive or inductive coupling. In capacitive coupling, an electrical input signal is applied to one plate of a capacitor to transmit an electrostatic signal across an insulating dielectric to a second plate at which at output signal is developed. In inductive coupling, an electrical input signal is applied to a first coil to transmit an electromagnetic field across an insulating gap to a second coil, which generates the isolated output signal. Both such isolators essentially block steady state or DC electrical signals.

Such isolators, although simple, block the communication of signals that have significant low frequency components. Further, these isolators can introduce significant frequency dependent attenuation and phase distortion in the transmitted signal. These features make such isolators unsuitable for many types of signals including many types of high-speed digital communications.

In addition, it is sometimes desirable to provide high voltage (>2 kV) isolation between two different portions of a system, while maintaining a communication path between these two portions. This is often true in industrial control applications where it is desirable to isolate the sensor/actuator portions from the control portions of the overall system.

What is therefore needed is an isolated on-board current and/or voltage sensor that may be pre-calibrated during manufacturing to simplify use to the end user and that provides an isolated output.

BRIEF SUMMARY OF THE INVENTION

In accordance with one aspect of the invention, an on-board microelectromechanical system (MEMS) electrical device is provided for sensing an electrical property of a power transistor having a collector, a base, and an emitter. Henceforth these terms will be used to indicate generally a power input, a control input, and a power output and thus indicate, generically, any power semiconductor and embrace the terms drain, gate, and source, and other terms for such terminals of these devices. It should be further appreciated that the present invention is intended to be applicable to sensing electrical properties of diodes, which traditionally only have two terminals (anode and cathode).

In one preferred form, the device comprises 1) a substrate; 2) an element supported by the substrate and movable between a first and second position; 3) an actuator attached to the element to receive an input electrical signal from the transistor that exerts a force dependent on the input electrical signal urging the element toward the second position; 4) a bias structure attached to the element to exert a predetermined opposite force on the element urging the element towards the first position; and 5) a sensor attached to the second portion of the element to provide an output electrical signal indicating movement of the element between the first position and the second position.

This and other aspects of the invention are not intended to define the entire scope of the invention, for which purpose claims are provided. In the following description, reference is made to the accompanying drawings, which form a part hereof, and in which there is shown by way of illustration, and not limitation, a preferred embodiment of the invention. Such embodiment does define the scope of the invention and reference must therefore be made to the claims for this purpose.

BRIEF DESCRIPTION OF THE DRAWINGS

Reference is hereby made to the following figures in which like reference numerals correspond to like elements throughout, and in which.

DETAILED DESCRIPTION OF THE PREFERRED EMBODIMENT

Figure 1:
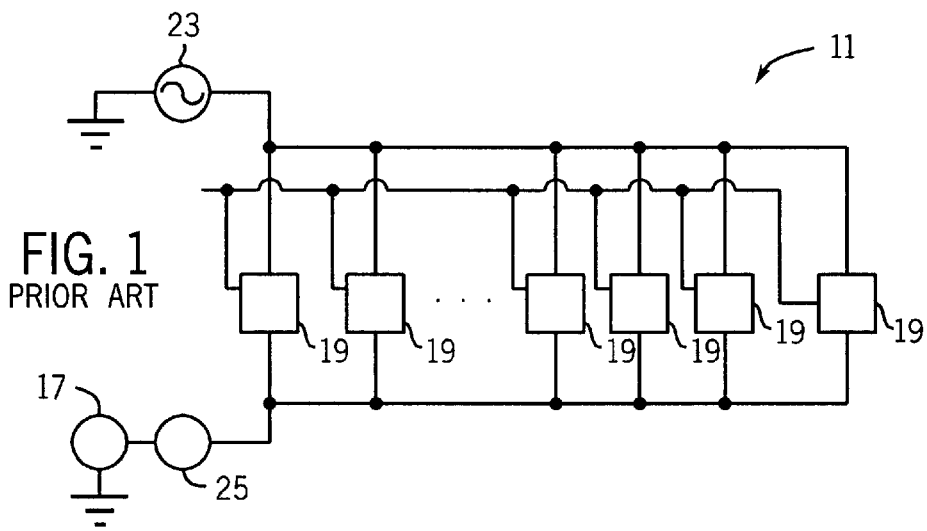
FIG. 1 is a simplified schematic diagram of a current sensing system in accordance with the prior art.
Figure 2:
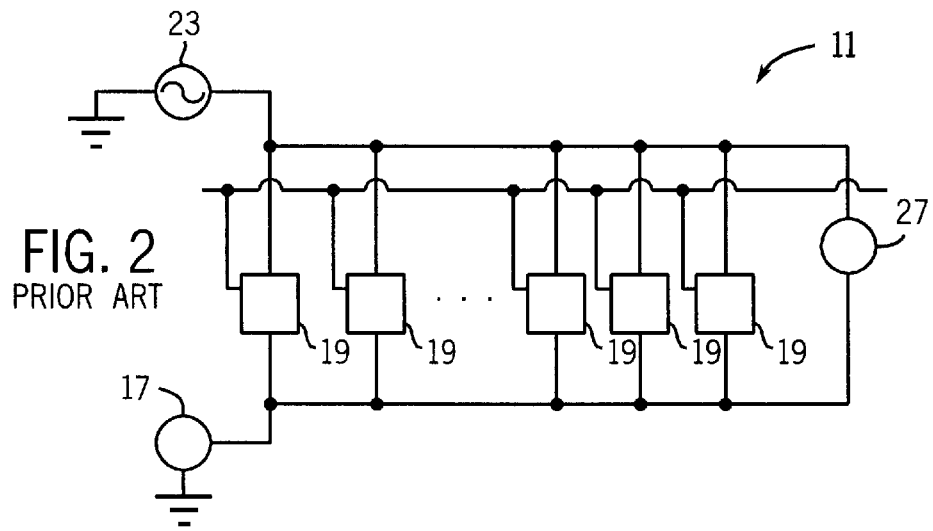
FIG. 2 is a simplified schematic diagram of a voltage sensing system in accordance with the prior art.
Figure 3:
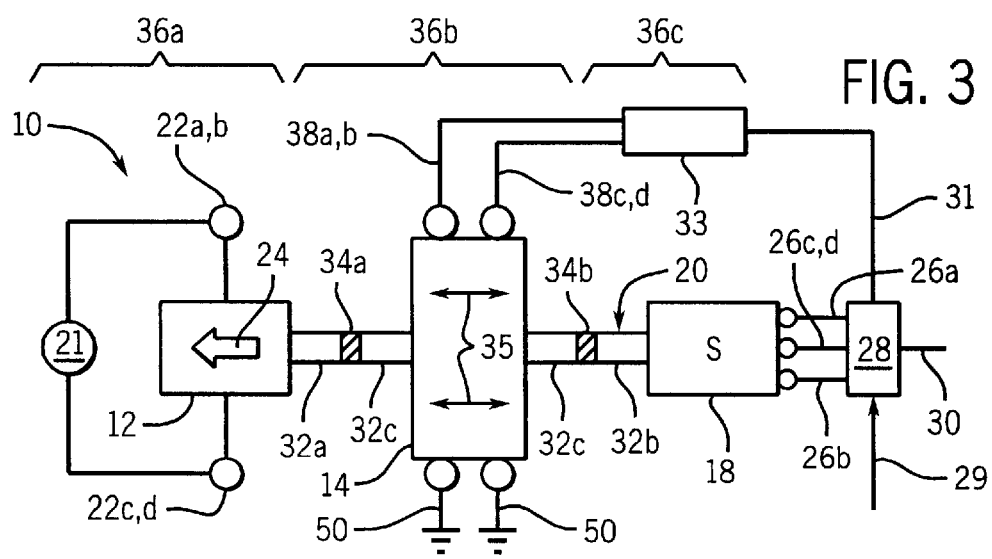
FIG. 3 is a simplified block diagram of the present analog isolator showing its elements of an actuator, a control element, and a sensor communicating along the single mechanical element that is movable to transmit data between the actuator and the sensor and showing insulating portions of the movable element.

Referring now to FIG. 3, a MEMS analog isolator 10 in accordance with the preferred embodiment includes an actuator 12, control element 14, and sensor 18 mechanically interconnected by a movable beam 20.

The actuator 12 includes terminals 22a–22b and 22c–22d through which an analog electrical input signal 21 may be received and converted to a mechanical force tending to move the beam 20 in an actuation direction 24. In the microscopic scale of the MEMS analog isolator 10, the actuator may be a piezoelectric actuator, a thermal-expansion motor, a mechanical-displacement motor, an electrostatic motor, or a Lorentz force motor generally known in the art. For a Lorentz force motor or thermal-expansion motor, the analog electrical input signal 21 will be a current, and for the piezoelectric or electrostatic motor, the input signal will be a voltage. Accordingly, MEMS analog isolator 10 is operable to function as either a current sensor or voltage sensor, as will become more apparent from the description below.

The actuator communicates with a first end of the beam 20. An opposite end of the beam is received by the sensor 18 which detects movement of the beam 20 and through its terminals 26a, and 26b, 26c+26d, produces an electrical signal that may be measured directly or further processed by processing electronics 28 to produce the output signal 20 indicating movement of the beam 20. Sensor 18 may be a piezoelectric-type sensor, a photoelectric sensor, a resistive sensor, an optical switching sensor, or a capacitive sensor according to techniques known in the art of MEMS design. In accordance with the preferred embodiments, the sensor 18 uses counterpoised movable plate capacitors as will be described in more detail below.

Attached to the beam 20 between the actuator 12 and the sensor 18 is the control element 14 which provides a force on the beam 20 opposite the actuation direction 24 and tending to resist the operation of the actuator 12 or with the actuation direction 24 augmenting the operation of the actuator as indicated by double-headed arrows 35.

Absent an analog electrical input signal 21, the control element 14 may hold the beam in a position toward the sensor 18. Ideally, control element 14 provides a force that increases with motion of the beam 20 in the actuation direction 24. In this way, a simple relationship between actuation force and movement of the beam 20 is generated (e.g. with a simple spring-type system). The MEMS analog isolator 10 provides extremely low friction and inertia so this movement or force is consistent and rapid.

Alternatively, the control element 14 may provide a rapidly increasing force (in a feedback system) arresting the movement of the beam 20 for any actuation force. Here the magnitude of the arresting force provides the output signal.

As described, the force provided by the control element 14 may be adjustable by varying a current or voltage to the structure and used in a feedback mode to essentially eliminate all but a small movement of the beam 20. Some movement of the beam 20 is necessary for the sensor to provide the necessary countervailing feedback, but the movement may be reduced to an extent that non-linearities in the actuators and mechanical elements of the MEMS analog isolator 10 that might occur with more pronounced movement are eliminated. Specifically, in this mode, the movement of the beam is detected by processing electronics 28 to produce a position signal. The position signal is compared against a reference signal 29 to produce an error signal 31 which is directed to the control element to produce a restoring force returning the beam 20 to the null point. The connection between the error signal to the control element may be direct or may be further modified by a feedback network 33 providing compensation for the system according to well-known feedback techniques. The feedback network 33 may steer voltage to either terminals 38c and 38d with a return at terminal 50 for actuation toward the sensor 18 or to terminals 38a and 38b with a return at terminal 50 for actuation toward the actuator 12 reflecting the fact that the electrostatic motors provide only a single direction of force.

The beam 20 includes conductive portions 32a and 32b, located at the actuator 12 and sensor 18, respectively, and such as may form part of the actuator 12 or sensor 18. Insulating portions 34a and 34b separate conductive portions 32a and 32b from a centermost conductive portion 32c that may be part of the control element 14; the insulating portions 34a and 34b thus defining three regions of raaisolation 36a–c. The first region 36a includes the actuator 12 and conductive portion 32a, the second region 36b includes the center conductive portion 32c and the control element 14, and the third region 36c includes the conductive portion 32b and sensor 18.

The insulated beam 20 provides a mechanism by which the analog electrical input signal 21 acting through the actuator 12 may produce a corresponding output signal at the sensor 18 electrically isolated from the analog electrical input signal 21. The control element 14 may be electrically isolated from either the input signal and/or the output signal 30.

The control element 14 is preferably a Lorentz-force motor or an electrostatic motor of a type that will be described below. For the former of the two control elements, terminals 38a and 38b and return 50 are provided to provide a bi-directional current dictating the counterveiling force provided by the control element 14. The direction of the current dictates the direction of the force. For the latter electrostatic structure, terminals 38a–d are provided. Voltage is applied either to terminal pair 38a and 38b (with reference to return 50) or to terminal pair 38c and 38d (with respect to return 50) to determine the direction of the force.

Figure 4:
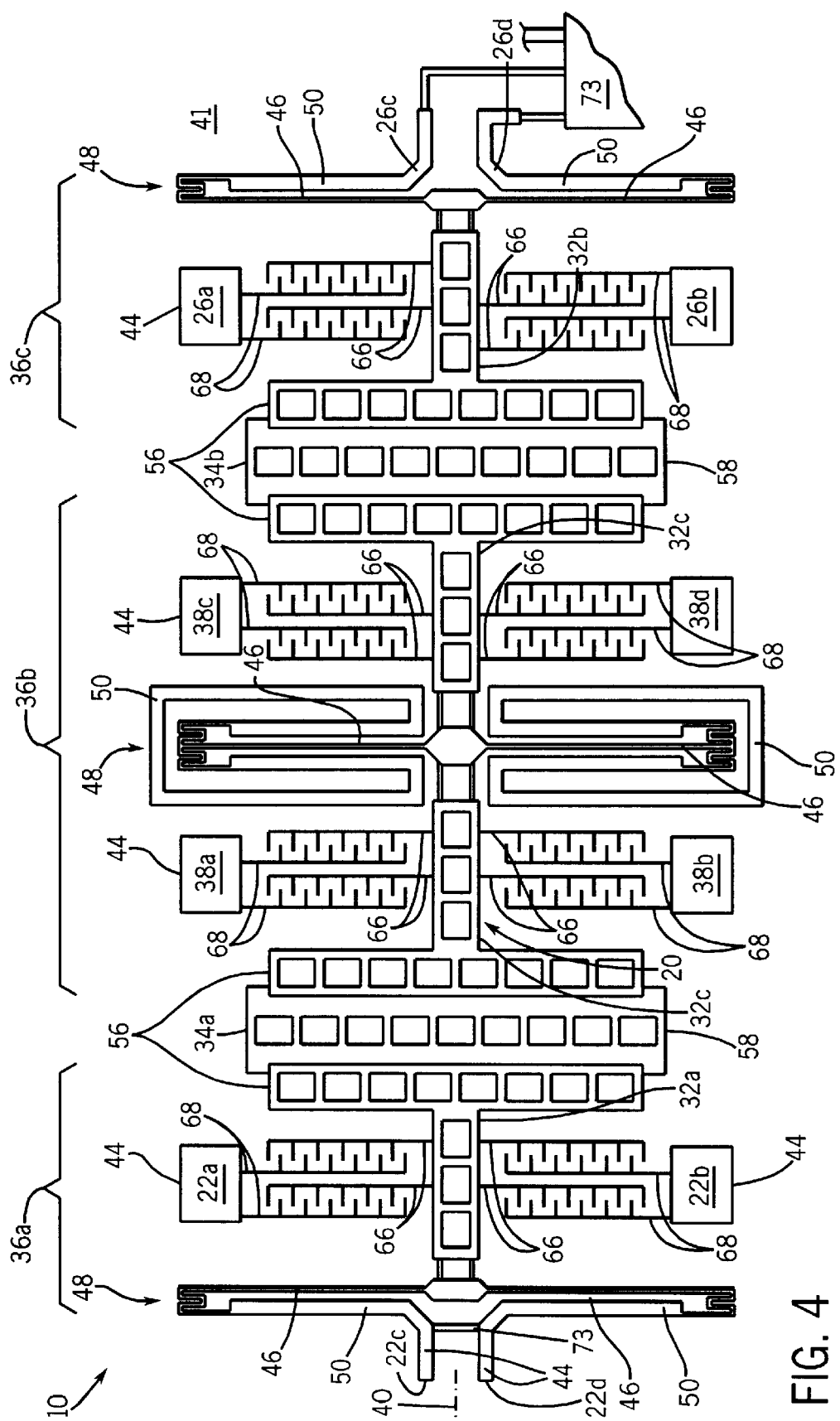
FIG. 4 is a top plan view of one embodiment of the isolator of FIG. 3 using three electrostatic motors and a capacitive sensor showing support of a moving beam connecting these components by means of flexible transverse arms and showing implementation of the insulating sections of the beam.
Figure 6:
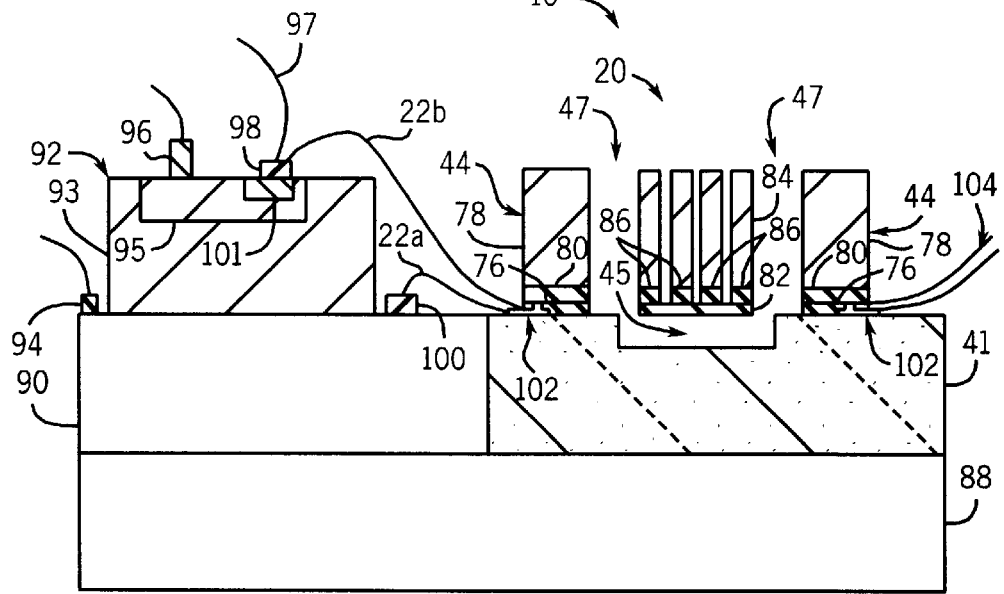
FIG. 6 is a simplified schematic diagram of a semiconductive controller having an onboard MEMS voltage sensor.

Referring now also to FIGS. 4 and 6, the beam 20 may extend above a substrate 41 along a longitudinal axis 40 passing along a midline between transversely opposed pylons 44 attached to a substrate 41. The pylons 44 form the terminals 22a and 22b, 38a–b, 26a, and 26b described above. Ideally, the substrate 41 is an insulating substrate and thus pylons 44 are all mutually isolated and particular conductive layers are placed or wire bonding is used to make the necessary connections.

The beam 20 is supported away from the substrate 41 and held for movement along the longitudinal axis 40 by means of flexing arm pairs 46 extending transversely on opposite sides of both ends of the beam 20 and its middle. During fabrication of the MEMS isolator 10, the movable beam 20 may be released from the substrate 41 by etching into an internal void disposed in either the substrate, as is described in U.S. Patent Publication No. 20020158040 entitled "Method for Fabricating a Microelectromechanical System (MEMS) Device Using a Pre-Patterned Substrate", or the beam itself, as is described in U.S. Patent Publication No. 20020158039 entitled "Method for Fabricating an Isolated Microelectromechanical System (MEMS) Device Using an Internal Void" the disclosures of which are hereby incorporated by reference as if set forth in entirety herein. The flexing arms 46 extend away from the beam 20 to elbows 48, transversely removed from the beam 20 on each side of the beam 20. The elbows 48 in turn connect to expansion compensators 50, which return to be attached to the substrate 41 at a point near the beam 20. As mentioned above, these expansion compensators are not absolutely required. Rather they serve as stress relief if needed. The flexing transverse arms 46 are generally parallel to expansion compensators 50 to which they are connected. The flexing transverse arms 46, elbows 48 and expansion compensators are conducted to provide electrical connections between the conductive portions 32a, 32b and 32c and stationary electrical terminals (not shown).

Portion 32a of the beam 20, such as provides a portion of the actuator 12, may have transversely outwardly extending, moving capacitor plates 66 overlapping with corresponding transversely inwardly extending stationary capacitor plates 68 attached to the pylon 44 representing terminals 22a and 22b. Each of the moving capacitor plates 66 and their corresponding stationary capacitor plates 68 may have mutually engaging fingers (as opposed to being simple parallel capacitors) so as to provide for a more uniform electrostatic force over a greater range of longitudinal travel of the beam 20. The electrostatic motor thus formed operates using the attraction between capacitor plates 66 and 68 with the terminals 22b and 22a connected so as to have a voltage difference with respect to beam 20 (connected to terminals 22c plus 22d), to urge the beam in the actuation direction 24. For this reason, stationary capacitor plates 68 are after the moving capacitor plates 66 on both sides of the beam as one travels along the actuation direction 24. Capacitor plates 66 and 68 are cantilevered over the substrate 41 by the same etching used to free the beam 20 from the substrate 41, as described above.

The pylons 44 flanking portion 32c of the beam such as formed pads 38a and 38d likewise include moving and stationary capacitor plates 66 and 68 in two distinct pairs. As noted, this section provides the control element 14 and as such, two electrostatic motors; 1) using terminals 38a and 38d; created to produce a force in the opposite direction of actuator 12 with the moving capacitor plates 66 following the stationary capacitor plate 68 as one moves in the actuation direction 24 and the other (using terminals 38a and 38b) creates to produce a force in the same direction to the actuator 12 with the moving capacitor plates 66 preceding the stationary capacitor plates 68 as one moves in the actuation direction 24. These two actuators may be used in combination to provide control of the closed loop system.

Portion 32b of the beam also supports moving capacitor plates 66 and stationary capacitor plates 68. However, in this case, the capacitor plates do not serve the purpose of making an electrostatic motor but instead serve as a sensing means in which variation in the capacitance with the moving capacitor plates 66 and stationary capacitor plates 68 serves to indicate the position of the beam 20. In this regard, the order of the stationary and moving capacitor plates 66 and 68 is reversed on the opposite sides of the beam 20. Thus, the moving capacitor plates 66 precede the stationary capacitor plates 68 on a first side of the beam (the upper side as depicted in FIG. 4) as one moves in the actuation direction 24 (as measured between terminal 26a and terminal 26c plus 26d) whereas the reverse order occurs on the lower side of the beam 20 (as measured between terminal 26b and terminal 26c plus 26d). Accordingly, as the beam 20 moves in the actuation direction 24, the capacitance formed by the upper moving capacitor plates 66 and stationary capacitor plates 68 increases while the capacitance formed by the lower plates decreases. The point where the value of the upper capacitance crosses the value of the lower capacitance precisely defines a null point and is preferably set midway in the travel of beam 20.

Techniques for comparing capacitance well known in the art may be used to evaluate the position of beam 20. One circuit for providing extremely accurate measurements of these capacitances is described in U.S. Pat. No. 6,501,282, the disclosure of which is hereby incorporated by reference as if set forth in its entirety herein. Generally, the MEMS analog isolator 10 is constructed to be symmetrical about an axis through the middle of the beam 20 along the longitudinal axis 40 such as to better compensate for thermal expansions. In addition, the operating area of the plates of the capacitors, plates 66 and 68 on both sides of the beam 20 for the actuator 12 and the control element 14 are made equal so as to be balanced. For similar reasons, the capacitors of the electrostatic motors and the control element 14 are placed between flexing transverse arm pairs 46 so as to better control slight amounts of torsion caused by uneven forces between the capacitor plates 66 and 68. While isolator 10 is illustrated and described herein as analog, it should be understood to one having ordinary skill in the art that a digital isolator could be used instead. Such a digital isolator is described, for example, in U.S. Patent Publication No. 20020125117 entitled "Microelectromechanical System (MEMS) Digital Electrical Isolator", the disclosure of which is hereby incorporated by reference as if set forth in its entirety herein.

Figure 5:
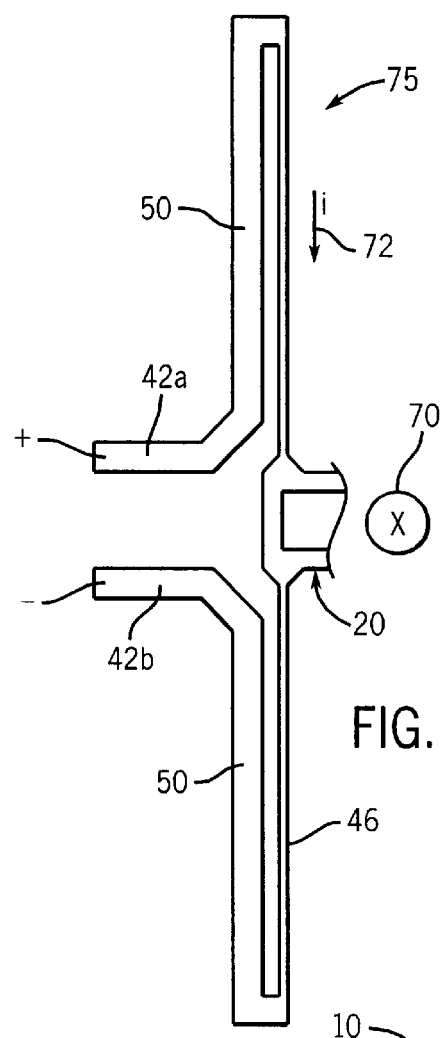
FIG. 5 is a view of one pair of transverse arms of FIG. 4 showing electrical separation of the arms of the pair to allow a current to be imposed on the arm to create a Lorentz-force motor such as may be substituted for the electrostatic motors of FIG. 4.

Referring now to FIGS. 3 and 5, it should be appreciated to a skilled artisan that one or both of the electrostatic motors forming the actuator 12 and the control element 14, described above, may be replaced with Lorentz-force motors 75 in which forces are generated not by electrostatic attraction between capacitor plates, but by the interaction of a current with a magnetic field. In the Lorentz-force motor 75, a magnetic field (e.g. with a permanent magnet, not shown) may be generated adjacent to the MEMS analog isolator 10 to produce a substrate-normal magnetic flux 70. The expansion compensators 50 supporting the flexing transverse arm 46 on opposite sides of the beam 20 are electrically isolated from each other so that a voltage may be developed across expansion compensators 50 to cause a current 72 to flow through the flexing transverse arm 46. This current flow in the magnetic field generated by the magnet will produce a longitudinal force on the beam 20 that may act in lieu of the electrostatic motors. The amount of deflection is generally determined by the flux density of the magnetic filed 70, the amount of current and the flexibility of the flexing transverse arm pairs 46 in accordance with the right hand rule.

The Lorentz-force motors 75 are two quadrant meaning that they will accept currents in either direction to produce a force with or opposed to the actuation direction 24. Hence with Lorentz-force motors 75 (or the bi-directional electrostatic motor of the control element 14 described above), the MEMS analog isolator 10 may operate with two polarities unlike an optical isolator.

Referring now to FIG. 6 in particular, each power semiconductor is made up of a plurality of transistors 92 are connected in parallel so as to provide an IGBT, NPN bipolar transistor, or MOSFET power transistor 89 (see, e.g. FIG. 10), as understood by those having ordinary skill in the art. It should thus be understood that the present invention is not limited to any particular type of semiconductor device that is being sensed.

Transistor element 92, for example, may include an n-doped silicon wafer 93 that is supported by a conductive die 88 to provide a multichip module (MCM). The die may be nonconductive and comprise, for example, epoxy, ceramic, glass, or the like. Alternatively, die 88 could comprise a thermally conducting material to facilitate heat dissipation. A bond metal layer 90 may be disposed between wafer 93 and die 88. Heat dissipation may thus be achieved from wafer 93, through bond metal 90, and across die 88. Metal layer 90 also acts to collect the current flowing into wafer 93. Terminal 94 attached to this layer is then the collector contact.

A layer of p-doped silicon 95 extends partially across the upper region of wafer 93. A base terminal 96 is connected to layer 95. Because layer 95 is semiconducting, there is no need to provide additional isolation between terminal 96 and layer 93. A layer of n-doped silicon 101 is embedded within p-doped layer 95, and presents an exposed face that is connected to an emitter terminal 98 used for voltage sensing, as will be described in more detail below. A collector terminal 100 is disposed on metal layer 90, as another collector contact. Collector 94 is disposed on metal layer 90 and connected to a source (not shown). Alternatively, wafer 93 could be disposed directly onto die 88, in which case the collector 94 would be disposed directly on die 88. Collector 94 could alternatively be disposed on any conductive material that is suitable to transport the voltage to collector terminal 100. It should be appreciated that semiconductor 92 may alternatively be fabricated using any doping process understood by those having ordinary skill in the art.

In accordance with the preferred embodiment, transistor 92 is fabricated so as to be supported by the die 88 that also supports MEMS device 10 such that the end product is a semiconductor device having an on-board MEMS voltage sensor. A MEMS device 10 of the type described above is schematically illustrated in FIG. 6, and provides an on-board voltage sensor to transistor 92 as will now be described. Isolator 10 may be fabricated using any of the methods described in: 1) U.S. Patent Publication No. 20020158040 entitled "Method for Fabricating a Microelectromechanical System (MEMS) Device using a Pre-Patterned Substrate"; 2) U.S. Patent Publication No. 20020159218 entitled "Method for Fabricating an Isolated Microelectromechanical System (MEMS) Device Incorporating a Wafer Level Cap"; 3) U.S. Patent Publication No. 20020158039 entitled "Method for Fabricating an Isolated Microelectromechanical System (MEMS) Device Using an Internal Void"; and 4) U.S. Patent Publication No. 20030060051 entitled "Method for Constructing an Isolated Microelectromechanical (MEMS) Device Using Surface Fabrication Techniques" the disclosures of each of which are hereby incorporated by reference as if set forth in their entirety herein.

The device 10 includes a pair of pylons 44 extending above substrate 41 and having therebetween a movable element, such as beam 20 that is free from the substrate via an internal void 45 enabling relative movement, as described above. The stationary pylons 44 and movable beam 20 define therebetween a gap 47 whose size tends to vary in response to movement of element 20, which may be used to accurately determine an input voltage strength.

MEMS device 10 is disposed on a substrate 41 which, in turn, is supported by die 88. While the substrate 41 is insulating in accordance with the preferred embodiment, such as the case where a high degree of electrical isolation is required for a given application, it could be conducting depending on the intended use of the MEMS device. Substrate 41 may thus comprise glass, high resistivity silicon, crystalline sapphire, crystalline silicon, polycrystalline silicon, silicon carbide, or a ceramic such as alumina, aluminum nitride, and the like, or gallium arsenide. In fact, the substrate may comprise any material whatsoever that is suitable for supporting a MEMS device 10. Alternatively, MEMS device may be disposed directly onto die 88 so long as electrical isolation is achieved between the movable elements 20 and die 88.

The pylons 44 include a base layer 76 that is preferably insulating if high isolation is desired, and is necessary if substrate 41 is conducting. In accordance with the preferred embodiment, layer 76 comprises silicon dioxide ($SiO_2$), which may be formed by thermal oxidation of a silicon wafer, or by depositing a layer of silicon dioxide, for example, by using chemical vapor deposition (CVD) or plasma enhanced chemical vapor deposition (PECVD), as is understood by those having ordinary skill in the art. Alternatively, a silicon-on-insulator (SOI) wafer could be provided, treated, and patterned to provide insulating layer 76 having a conductive silicon layer 78 extending therefrom.

An additional conductive layer 80 may also be disposed above layer 76. Alternatively, layer 80 could be disposed on top of layer 78. The movable element 20 includes a base 82 that is preferably insulating to achieve electrical isolation, and conductive elements 84 extending therefrom that comprises silicon in accordance with the preferred embodiment. An optional conductive layer 86 is disposed within element 20, and aligned with conductive layer 80 to provide enhanced electrical communication between the pylons 44 and movable member 20.

Terminals 102 are embedded within insulating layer 76 so as to enable MEMS device 10 to be connected to terminals 98 and 100 via bond wires 22b and 22a, respectively. Terminals 102 may be implemented in combination with a wafer level cap, as noted above.

Accordingly, the voltage that is transmitted from collector 94 to terminal 100 is further transmitted via bond wire 22a to terminal 102 at one end of the MEMS device 10. A second terminal 102 located at the other end of the MEMS device 10 (but on the same side of moveable element 20) is connected to terminal 98 via wire 22b, such that MEMS device 10 is wired in parallel to transistor 92 in order to accurately sense voltage. Wire 97 is the emitter bond wire, and die 88 provides an interconnection between the other paralleled die level transistor cells, as described above. The measured output voltage from MEMS device 10 travels along signal bond wires 104 to any circuit potential in the overall device or machine in which the semiconductor and MEMS device are installed.

Figure 7:
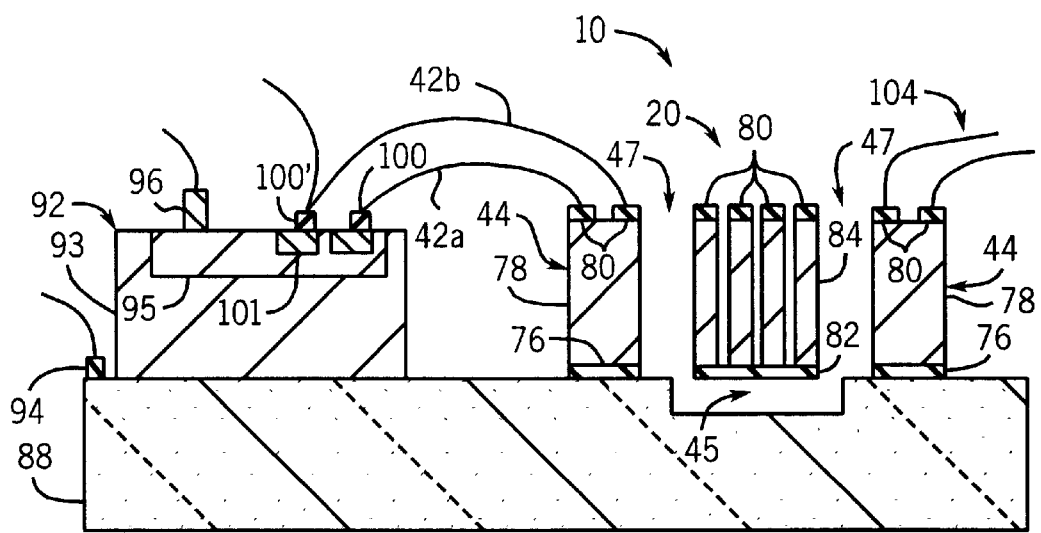
FIG. 7 is a simplified schematic block diagram of a semiconductive controller having an onboard current sensor.

Referring now to FIG. 7, the MEMS device 10 described above may also provide a current sensor responsive having a Lorentz force motor, as described above. Transistor 92 and MEMS device 10 are disposed directly onto die 88 rather than an intermediate conductive layer. As described above, transistor 92 is one of a plurality of transistors connected in parallel that, in combination, provide an IGBT, NPN bipolar transistor, or MOSFET transistor. Transistor 93 includes a collector terminal 94 that is disposed directly onto die 88. A base terminal 96 is disposed on the p-doped section 95 of n-doped silicon wafer 93. An emitter terminal 100 is disposed directly on conductive die 88. Accordingly, current from collector 94 travels into emitter terminal 100. Bond wire 42a transmits the current from emitter 100 to conductive terminal 80 on pylon 44. A second terminal 80 located at the other end of the MEMS device 10 (but on the same side of moveable element 20) connects the MEMS device 10 to the other transistors in series via wire 42b and emitter 100'. Transistor 92 is thus a multi emitter device, in which one emitter 100 is bypassed through the MEMS device 10, and then joins the other transistors via emitter 100'. MEMS device 10 measures the current using the principles of Lorentz forces, as described above, and outputs the current to any circuit potential in the overall device or machine in which the transistor 92 and MEMS device 10 are installed via signal bond wires 104.

As described above, the MEMS current sensor receives only a portion of the total current flow through the plurality of transistors 92 which are connected in parallel so as to prevent high current from flowing through the MEMS device 10. The current received by the MEMS device is thus ideally a ratio of the equivalent of a plurality of transistors connected in parallel, one of which outputting current to the MEMS device. Accordingly, the measured current output may be multiplied by the number of transistors in the circuit to achieve an actual current measurement for the circuit.

Figure 8:
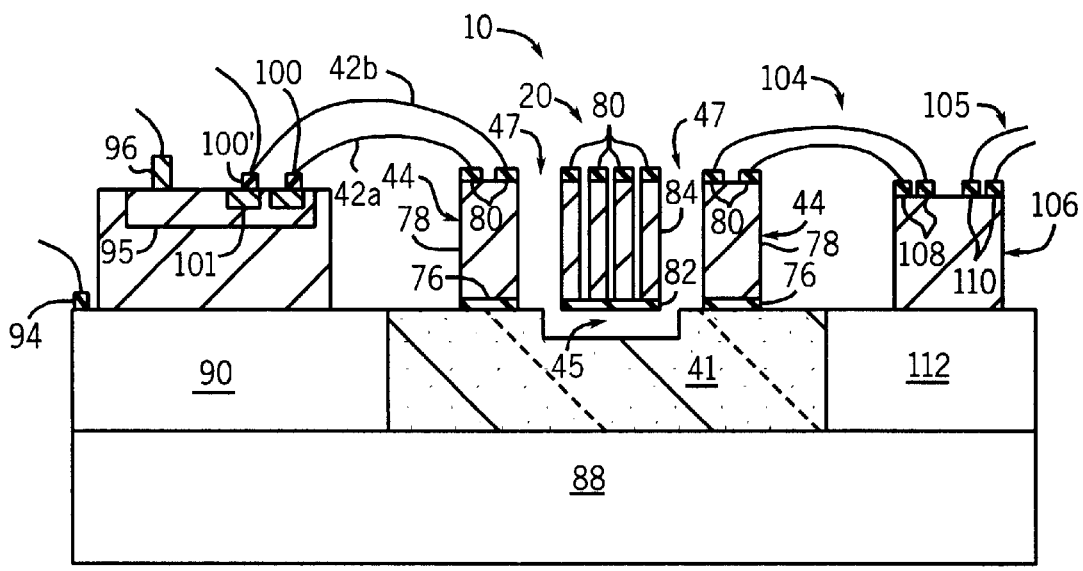
FIG. 8 is a simplified schematic block diagram of a semiconductive controller having an onboard MEMS current sensor and associated compensation circuitry.

Referring now also to FIG. 8, a MEMS device 10 provides a current sensor, as described above, wherein the transistor 92 is disposed on bond metal layer 90, and the MEMS device 10 is disposed on substrate 41. Bond metal layer 90 and substrate 41 are disposed on die 88, as described above. This embodiment recognizes that while, in theory, transistor 92 will output a level of current proportional to the number of transistors in the circuit, in actuality the current output from each transistor will vary slightly from being truly proportional. Accordingly, the transistor 92 may be calibrated during manufacturing by sending a predetermined amount of current through the plurality of transistors, measuring the output of transistor 92 with MEMS device 10, and calculating the current variance. The calculation is performed by a processor (not shown) in compensation circuitry 106. The variance having been determined for transistor 92 during manufacturing, the compensation circuitry 106 will output a more reliable indication during use to the end user. It is further appreciated that temperature fluctuations may also affect variance. Accordingly, compensation circuitry 106 may further include a measurement of the semiconductor device temperature, for example by monitoring the forward bias voltage of a test diode as is well known in the art, so as to further adjust the output based on the predictable response of the transistors to temperature. A unitary device is thus provided having a power source with an isolated and compensated current sensing system that can be applied to virtually any power semiconductor device.

Figure 9:
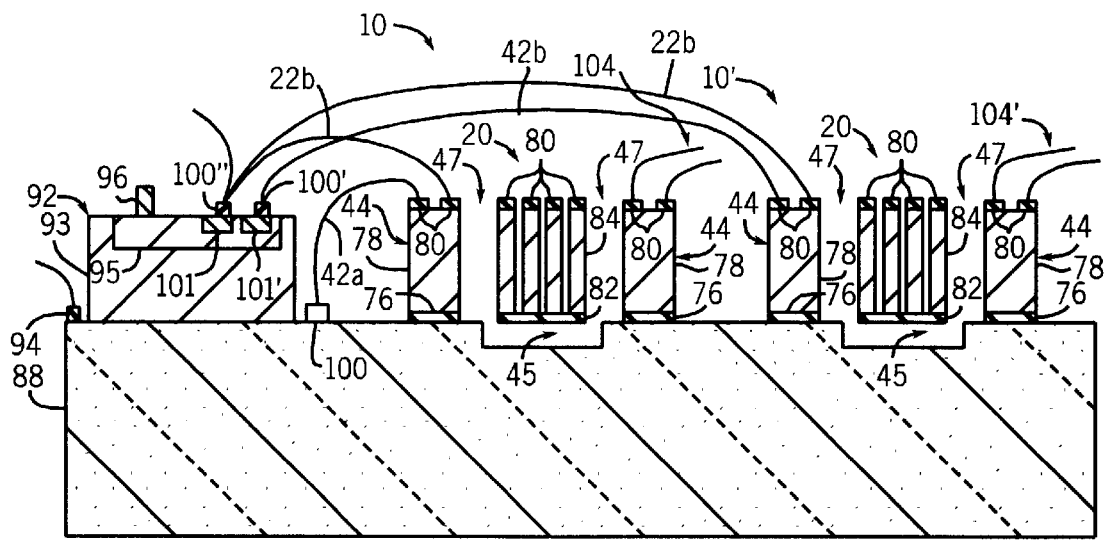
FIG. 9 is a simplified schematic block diagram of a semiconductive controller having onboard MEMS current and voltage sensors.
Figure 10:
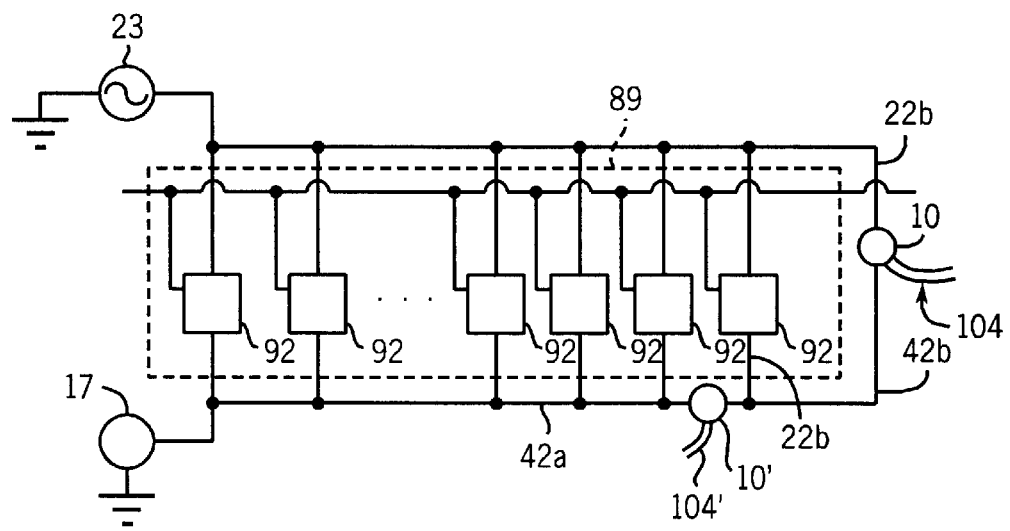
FIG. 10 is a schematic system diagram of the embodiment illustrated in FIG. 9.

Referring now to FIGS. 9 and 10, a pair of MEMS devices 10 and 10' may be fabricated on a single substrate 88 along with a power transistor 92 to provide measurements of both voltage and current output in the manner described above. In particular, a first MEMS device 10 is connected to the transistor 92 and provides a voltage sensor as described above with reference to FIG. 6, and a second MEMS device 10' is electrically connected to the transistor 92 and provides a current sensor as described above with reference to FIG. 7.

Transistor 92 includes a base terminal 96 mounted onto the p-doped section 95 of n-doped silicon wafer 93. Current flows from collector 94, through die 88, and into emitter terminal 100. A second emitter 100' is mounted onto n-doped section 101' of p-doped section 95 of silicon wafer 93. MEMS voltage sensor 10 is connected to transducer 92 via lead 42a extending from emitter 100 to terminal 80, and to the other transistors in parallel via emitter 100". The voltage is sensed as described above, and output via leads 104.

MEMS current sensor 10' is connected to transistor 92 via lead wire 42b which extends from emitter 100'. Sensor 10' determines current output as described above, and may optionally output via leads 104' as the measured current as described above. Sensor 10' is electrically connected to the other transistors in series via lead 22b and emitter 100". Advantageously, an end user is provided a power transistor having on-board reliable current and voltage sensing.

The above has been described as a preferred embodiment of the present invention. It will occur to those that practice the art that many modifications may be made without departing from the spirit and scope of the invention. For example, the principles of the present invention are not only applicable to the power semiconductor devices described above, but are widely applicable to any semiconductor or similar device, such as a diode. In order to apprise the public of the various embodiments that may fall within the scope of the invention, the following claims are made.

We claim:

1. An on-board micro-electromechanical (MEMS) electrical device for sensing an electrical property of a power transistor having a collector, a base, and an emitter disposed on a support, the device comprising:

a substrate connected to the support;

an element supported by the substrate and movable between a first and second position;

an actuator attached to the element to receive an input electrical signal from the transistor that exerts a force dependent on the input electrical signal urging the element toward the second position;

a bias structure attached to the element to exert a predetermined opposite force on the element urging the element towards the first position; and a sensor attached to the element to provide an output electrical signal indicating movement of the element between the first position and the second position.

2. The device as recited in claim 1, wherein the actuator is selected from the group consisting of: an electrostatic motor, a Lorentz force motor, a piezoelectric motor, and a thermal-expansion motor.

3. The device as recited in claim 2, wherein the device is connected in series to the power transistor to measure current flow therethrough.

4. The device as recited in claim 3, wherein the power transistor further comprises a plurality of transistors connected in parallel, and wherein the device is connected in series to one of the plurality of transistors to measure current flowing therethrough.

5. The device as recited in claim 4, further comprising compensation circuitry mounted onto the substrate for determining or correcting total current flow through the power transistor.

6. The device as recited in claim 2, wherein the device is connected in parallel with the power transistor to measure voltage therethrough.

7. The device as recited in claim 6, wherein the power transistor further comprises a plurality of transistors connected in parallel, and wherein the device measures voltage across one of the plurality of transistors.

8. The device as recited in claim 1, wherein the bias structure is selected from the group consisting of: an electrostatic motor, a Lorentz force motor, a piezoelectric motor, a thermal-expansion motor, and a mechanical-displacement motor.

9. The device as recited in claim 1, wherein the sensor is selected from the group consisting of: a capacitive sensor, a piezoelectric sensor, a photoelectric sensor, a resistive sensor, and an optical switching sensor.

10. The device as recited in claim 1, wherein at least a portion of the element is electrically insulated so as to electrically isolate the first and second locations from each other.

11. The device as recited in claim 1, wherein the substrate is conductive.

12. The device as recited in claim 1, wherein the substrate is insulating.

13. A power semiconductor device having on-board sensing capabilities, the device comprising:
   a plurality of power transistors electrically connected, wherein one of the power transistors is supported by a first substrate, and has a collector, a base, and an emitter;
   a first MEMS device disposed on a second substrate that is connected to the first substrate, wherein the MEMS device is in electrical communication with said one of the power transistors, said MEMS sensor including:
   i. an actuator attached to the element to receive an electrical input signal from said one of the power transistors;
   ii. an element supported by the second substrate for movement between a first and second position with respect to the substrate dependent upon the electrical input signal;
   iii. a bias structure attached to the element to exert a predetermined opposite force on the element urging the element toward the first position; and
   iv. a sensor attached to the second portion of the element to provide an output electrical signal indicating movement of the element between the first position and the second position;
   wherein an input signal of above a predetermined threshold overcomes the opposite force to cause the element to move rapidly from the first to the second position to produce the output electrical signal electrically isolated from the input electrical signal.

14. The semiconductor device as recited in claim 13, wherein the actuator is selected from the group consisting of: an electrostatic motor, a Lorentz force motor, a piezoelectric motor, and a thermal-expansion motor.

15. The semiconductor device as recited in claim 14, wherein the MEMS device is connected in series to said one of the transistors to measure current flowing therethrough.

16. The semiconductor device as recited in claim 15, further comprising compensation circuitry mounted onto the substrate, receiving the current output from the sensor, and calculating and/or correcting total current flow through the power transistor.

17. The semiconductor device as recited in claim 13, wherein the MEMS device is connected in parallel to said one of the transistors to measure voltage there-across.

18. The semiconductor device as recited in claim 13, wherein the first MEMS device is connected to the power semiconductor device to measure voltage therethrough, further comprising a second MEMS device having the element, the actuator, the bias structure, and the sensor, wherein the second sensor, wherein the second MEMS device is connected to the semiconductor device to measure current flowing therethrough such that the electrical output signal is a current output.

19. The semiconductor device as recited in claim 18, wherein the first MEMS device is connected in parallel to said one of the plurality of transistors.

20. The semiconductor device as recited in claim 19, wherein the second MEMS device is connected in series to said one of the plurality of transistors.

21. The semiconductor device as recited in claim 20, further comprising compensation circuitry receiving the current output from the second MEMS device and determining a total current flow across the semiconductor device.

22. The semiconductor device as recited in claim 18, wherein the second MEMS device is connected to said one of the plurality of transistors.

23. The semiconductor device as recited in claim 13, wherein the substrate is insulating.

24. The semiconductor device as recited in claim 13, wherein the substrate is conductive.

* * * * *